United States Patent
Bao et al.

(10) Patent No.: US 11,164,767 B2
(45) Date of Patent: Nov. 2, 2021

(54) INTEGRATED SYSTEM FOR SEMICONDUCTOR PROCESS

(71) Applicant: Applied Materials, Inc., Santa Clara, CA (US)

(72) Inventors: Xinyu Bao, Fremont, CA (US); Hua Chung, San Jose, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 46 days.

(21) Appl. No.: 16/591,354

(22) Filed: Oct. 2, 2019

(65) Prior Publication Data

US 2020/0035525 A1    Jan. 30, 2020

Related U.S. Application Data

(62) Division of application No. 15/418,506, filed on Jan. 27, 2017, now abandoned.
(Continued)

(51) Int. Cl.
*H01L 21/67* (2006.01)
*H01J 37/32* (2006.01)
(Continued)

(52) U.S. Cl.
CPC ...... *H01L 21/67207* (2013.01); *B08B 7/0035* (2013.01); *C30B 25/04* (2013.01);
(Continued)

(58) Field of Classification Search
CPC ......... H01L 21/67184; H01L 21/67201; H01L 29/66636; H01L 29/66795;
(Continued)

(56) References Cited

U.S. PATENT DOCUMENTS

| 6,281,098 B1 | 8/2001 | Wang et al. |
| 2003/0027427 A1 | 2/2003 | Ma et al. |

(Continued)

FOREIGN PATENT DOCUMENTS

| JP | 2012-503336 A | 2/2012 |
| KR | 10-2005-0062872 A | 6/2005 |

(Continued)

OTHER PUBLICATIONS

EP Search Report dated Mar. 16, 2020 for Application No. EP 17 85 1202.6.

(Continued)

*Primary Examiner* — Caleen O Sullivan
(74) *Attorney, Agent, or Firm* — Patterson + Sheridan LLP

(57) ABSTRACT

Implementations of the present disclosure generally relate to methods and apparatuses for epitaxial deposition on substrate surfaces. More particularly, implementations of the present disclosure generally relate to an integrated system for processing N-type metal-oxide semiconductor (NMOS) devices. In one implementation, a cluster tool for processing a substrate is provided. The cluster tool includes a pre-clean chamber, an etch chamber, one or more pass through chambers, one or more outgassing chambers, a first transfer chamber, a second transfer chamber, and one or more process chambers. The pre-clean chamber and the etch chamber are coupled to a first transfer chamber. The one or more pass through chambers are coupled to and disposed between the first transfer chamber and the second transfer chamber. The one or more outgassing chambers are coupled to the second transfer chamber. The one or more process chambers are coupled to the second transfer chamber.

20 Claims, 2 Drawing Sheets

Related U.S. Application Data

(60) Provisional application No. 62/395,083, filed on Sep. 15, 2016.

(51) Int. Cl.
| | | |
|---|---|---|
| *B08B 7/00* | (2006.01) | |
| *C30B 25/04* | (2006.01) | |
| *C30B 25/18* | (2006.01) | |
| *C30B 29/06* | (2006.01) | |
| *H01L 21/02* | (2006.01) | |
| *H01L 21/285* | (2006.01) | |
| *H01L 21/3065* | (2006.01) | |
| *H01L 29/66* | (2006.01) | |

(52) U.S. Cl.
CPC ............ *C30B 25/186* (2013.01); *C30B 29/06* (2013.01); *H01J 37/32458* (2013.01); *H01J 37/32899* (2013.01); *H01L 21/02046* (2013.01); *H01L 21/02532* (2013.01); *H01L 21/02636* (2013.01); *H01L 21/2855* (2013.01); *H01L 21/28518* (2013.01); *H01L 21/3065* (2013.01); *H01L 21/67167* (2013.01); *H01L 21/67184* (2013.01); *H01L 21/67201* (2013.01); *H01L 29/66636* (2013.01); *H01L 29/66795* (2013.01); *H01J 2237/334* (2013.01); *H01L 21/67196* (2013.01)

(58) Field of Classification Search
CPC ........... H01L 21/67196; H01L 29/6659; H01L 29/665; H01L 21/20; H01L 21/67034; H01L 21/67069; H01L 21/67207; H01L 21/67167; H01L 21/02046; H01L 21/02532; H01L 21/02636; H01L 21/28518; H01L 21/2855; H01L 21/3065; H01J 2237/334; H01J 37/32899; H01J 37/32458; B08B 7/0035; C30B 25/04; C30B 25/186; C30B 29/06
USPC ........................................................ 438/689
See application file for complete search history.

(56) References Cited

U.S. PATENT DOCUMENTS

| | | | |
|---|---|---|---|
| 2003/0062333 | A1 | 4/2003 | Kranz et al. |
| 2004/0056304 | A1* | 3/2004 | Ahmed ............... H01L 29/6656 257/336 |
| 2005/0106865 | A1 | 5/2005 | Chung et al. |
| 2008/0067557 | A1 | 3/2008 | Yu et al. |
| 2011/0175140 | A1 | 7/2011 | Taylor et al. |
| 2012/0021583 | A1 | 1/2012 | Wu et al. |
| 2012/0051872 | A1 | 3/2012 | Ku et al. |

FOREIGN PATENT DOCUMENTS

| | | |
|---|---|---|
| KR | 10-2006-0017871 A | 2/2006 |
| KR | 10-2009-0035578 A | 4/2009 |
| KR | 10-2012-0107496 A | 10/2012 |
| KR | 10-2016-0042010 A | 4/2016 |
| TW | 200737310 A | 10/2007 |
| TW | 201130016 A | 9/2011 |
| WO | 2008/005832 A2 | 1/2008 |

OTHER PUBLICATIONS

KR Office Action dated Apr. 21, 2021 for Application No. 10-2019-7010320.
KR Office Action dated Sep. 10, 2020 for Application No. 10-2019-7010320.
Taiwan Office Action dated Nov. 12, 2020 for Application No. 106120104.
PCT Notification of Transmittal of the International Search Report and the Written Opinion of the International Searching Authority for International Application No. PCT/US2017/015472; dated Jun. 15, 2017; 14 total pages.
KR OA dated Mar. 9, 2021 for Korean Patent Application No. 10-2019-7010320.
European Search Report dated May 5, 2020 for Application No. EP 17 85 1202.
Korean OA dated Jun. 15, 2021 for Application No. 10-2021-7015560.
Taiwan Office Action dated May 6, 2021 for Application No. 106120104.

* cited by examiner

INTEGRATED SYSTEM FOR SEMICONDUCTOR PROCESS

CROSS-REFERENCE TO RELATED APPLICATIONS

This application is a divisional of co-pending patent application Ser. No. 15/418,506, filed Jan. 27, 2017 which claims priority to U.S. Provisional Patent Application Ser. No. 62/395,083, filed on Sep. 15, 2016, each of which herein is incorporated by reference.

BACKGROUND

Field

Implementations of the present disclosure generally relate to methods and apparatuses for epitaxial deposition on substrate surfaces.

Description of the Related Art

Integrated circuits are formed in and on silicon and other semiconductor substrates. In the case of single crystal silicon, substrates are made by growing an ingot from a bath of molten silicon, and then sawing the solidified ingot into multiple wafers. An epitaxial silicon layer may then be formed on the monocrystalline silicon wafer to form a defect-free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to typical wafer fabrication facility ambient conditions. For example, contaminants present in the ambient environment may deposit on the monocrystalline surface. Additionally, the various chemical interactions utilized to form the semiconductor components may interact during manufacturing and contaminate or degrade both the chamber components and the substrate. Moreover, current process systems suffer from low throughput when manufacturing substrates having advanced device integration schemes.

Therefore, there is a need for an integrated system for manufacturing semiconductor devices.

SUMMARY

The present disclosure generally relate to methods and apparatuses for epitaxial deposition on substrate surfaces. More particularly, implementations of the present disclosure generally relate to an integrated system for processing n-type metal-oxide semiconductor (NMOS) devices. In one implementation, a cluster tool for processing a substrate is provided. The cluster tool includes a first transfer chamber, a pre-clean chamber coupled to the first transfer chamber, an etch chamber coupled to the first transfer chamber, a second transfer chamber coupled to the first transfer chamber, one or more pass through chambers disposed between the first transfer chamber and the second transfer chamber, one or more outgassing chambers coupled to the second transfer chamber, and one or more deposition chambers coupled to the second transfer chamber.

In another implementation, a cluster tool includes a first transfer chamber, a pre-clean chamber coupled to the first transfer chamber, an etch chamber coupled to the first transfer chamber, a second transfer chamber coupled to the first transfer chamber, and four epitaxial deposition chambers coupled to the second transfer chamber.

In another implementation, a cluster tool includes a first transfer chamber, a pre-clean chamber coupled to the first transfer chamber, an etch chamber coupled to the first transfer chamber, a second transfer chamber coupled to the first transfer chamber, two pass through chambers disposed between the first transfer chamber and the second transfer chamber, one or more outgassing chambers coupled to the second transfer chamber, and four epitaxial deposition chambers coupled to the second transfer chamber.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
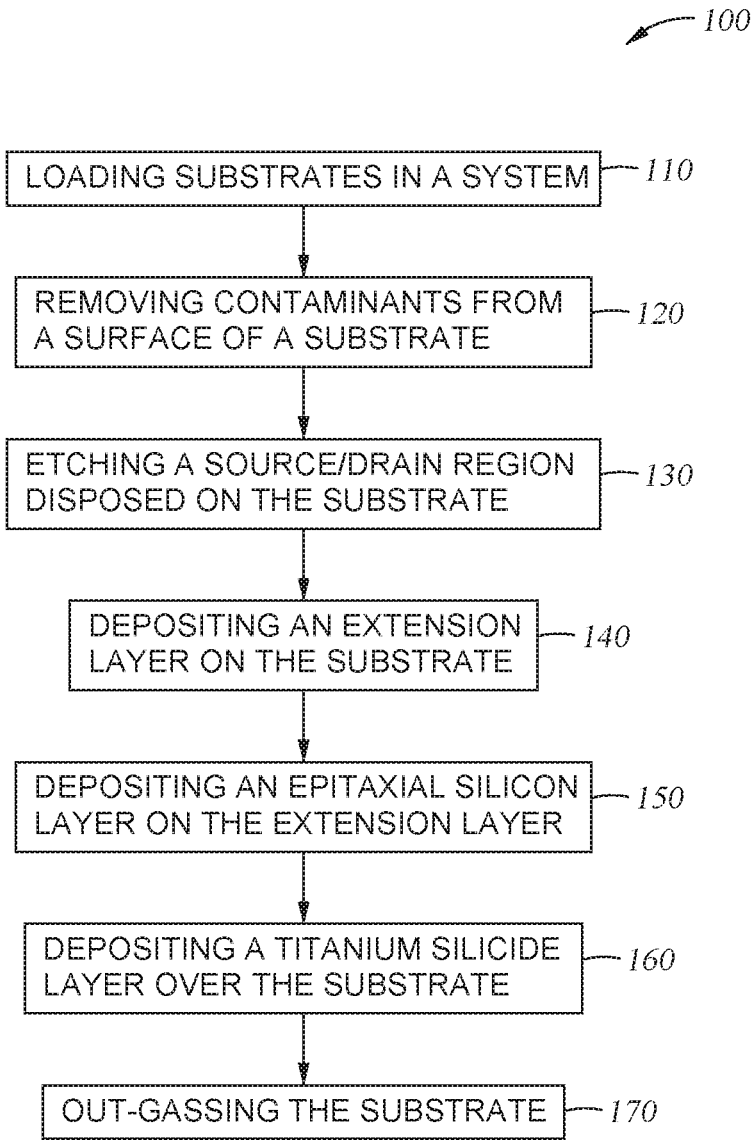
FIG. 1 is a flow chart illustrating a method in accordance with one implementation of the present disclosure.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure generally describes methods and apparatuses for epitaxial deposition on substrate surfaces. Implementations described herein will be described below in reference to cleaning, etching and deposition processes that can be carried out using systems available from Applied Materials, Inc. of Santa Clara, Calif. Other tools capable of performing these cleaning, etching and deposition processes may also be adapted to benefit from the implementations described herein. In addition, any system enabling the cleaning, etching and deposition processes described herein can be utilized advantageously according to the implementations described herein. The apparatus described herein is illustrative and should not be construed or interpreted as limiting the scope of the implementations described herein.

FIG. 1 illustrates a method 100 in accordance with one implementation of the present disclosure. Method 100 starts at operation 110, in which one or more substrates are loaded to the system. In one implementation, the substrates are loaded into the system using pods. The pods typically are front opening unified pods (FOUP) that are accessible from a clean room.

At operation 120, a substrate is transferred to a first process chamber to remove a native oxide on a surface of the substrate by a cleaning process. The substrate may include a silicon-containing material, and the surface may include a material, such as silicon (Si), germanium (Ge) or silicon germanium alloys (SiGe). In some implementations, the Si, Ge, or SiGe surface may have an oxide layer, such as native oxide layer, disposed thereon. The substrate may be a semiconductor substrate with devices formed thereon. In one implementation, the substrate has a plurality of semiconductor fins formed thereon, and each semiconductor fin may be located between two trenches formed in a dielectric material. The native oxide layer may be formed on the plurality of fins and in the trenches. In one implementation, operation 120 is performed in a process region of a first process chamber. In one implementation, the first process chamber is positioned on a cluster tool allowing for transfer of the substrate without exposing the substrate to atmosphere (e.g., in a vacuum environment.)

Any suitable cleaning process that removes oxides from the substrate without significantly damaging the substrate may be used. Suitable cleaning processes include sputter etch processes, plasma dry etch processes, or combinations thereof. Exemplary cleaning processes include $NF_3/NH_3$ plasma-based processes or $NF_3/NH_3$ inductively coupled plasma processes.

In one implementation, the plasma etch process is a remote plasma assisted dry etch process which involves the simultaneous exposure of a substrate to $NF_3$ and $NH_3$ plasma by-products. In one implementation, the plasma etch process may be an inductively couple plasma (ICP) process. The plasma etch process may be performed in a SiCoNi™ chamber that is available from Applied Materials, Inc. of Santa Clara, Calif. The first process chamber may be the SiCoNi™ chamber. The remote plasma etch can be predominantly conformal and selective towards silicon oxide layers, and thus does not readily etch silicon regardless of whether the silicon is amorphous, crystalline or polycrystalline. The plasma etch process results in a substrate surface having silicon-hydrogen (Si—H) bonds thereon.

In one implementation, after operation 120, the substrate is removed from the first process chamber and transferred to a second process chamber where operation 130 is performed. The first process chamber and the second process chamber may be positioned on the cluster tool allowing for transfer of the substrate without exposing the substrate to atmosphere (e.g., in a vacuum environment). The second process chamber may be the Selectra™ etch chamber that is available from Applied Materials, Inc. of Santa Clara, Calif. In another implementation, both operation 120 and operation 130 are performed in the same process chamber. At operation 130, silicon is removed from a source/drain region disposed on the substrate. In one implementation, the silicon is removed from the source/drain region using an etching process. In one implementation, the substrate includes a plurality of semiconductor fins and trenches formed in a dielectric material, and a portion of each semiconductor fin located within each trench is removed. Each semiconductor fin may be fabricated from silicon. The semiconductor fin may be the source/drain region of an n-MOS transistor, and the removal of portions of the semiconductor fin may be referred to as source/drain extension etch back. The silicon etching process may be a plasma-based etching process.

During the plasma-based etching process, an etching process gas is introduced into the chamber. The etching process gas may comprise one or more etchants. The etchants may be excited by a RF power. The etchant includes a halogen-containing gas, optionally a hydrogen-containing gas, and optionally an inert gas. In one implementation, the halogen-containing gas is chlorine gas, the hydrogen-containing gas is hydrogen gas, and the optional inert gas is argon, helium, or both. Exemplary chlorine-containing gases include diatomic chlorine ($Cl_2$) gas. The inert gas may include at least one of argon, helium, neon, xenon and the like.

At operation 140, the substrate is removed from the second process chamber and transferred to a third process chamber where an epitaxial layer is deposited on the surface of the substrate. In one implementation, both the second process chamber and the third process chamber are positioned on a cluster tool allowing for transfer of the substrate from the second process chamber to the third process chamber without exposing the substrate to atmosphere (e.g., in a vacuum environment.) The third process chamber may be a reduced pressure (RP) Epi chamber that is available from Applied Materials, Inc. of Santa Clara, Calif. The surface of the substrate is substantially or completely contaminant free which improves the quality of the epitaxial layer subsequently formed on the surface of the substrate. In one implementation, the epitaxial layer may be silicon doped with arsenide (Si:As). The epitaxial layer may be a binary film, ternary film, or quaternary film. The epitaxial layer may be deposited using any suitable epitaxial deposition technique, such as selective epitaxial deposition. In one implementation, the epitaxial layer is a Si:As layer and is deposited on a portion of each semiconductor fin that is inside of each trench. The epitaxial layer may be referred to as a source/drain extension layer.

At operation 150, the substrate is transferred to a fourth process chamber and an epitaxial layer may be formed on the substrate. The epitaxial layer may be formed by an epitaxial deposition process, such as a selective epitaxial deposition process. The fourth process chamber may be a RP Epi chamber that is available from Applied Materials, Inc. of Santa Clara, Calif. In one implementation, operation 140 and operation 150 are performed in the same process chamber, such as a RP Epi chamber. In one implementation, the epitaxial layer is silicon doped with phosphorous (Si:P). The surface of the substrate is contaminant free which improves the quality of the epitaxial layer subsequently formed on the surface of the substrate. In one implementation, the epitaxial layer is a Si:P layer and is deposited in each trench formed in the dielectric material, and the Si:P layer is in contact with the Si:As layer that is formed on each semiconductor fins on the substrate.

At operation 160, the substrate is transferred to a fifth process chamber and a titanium silicide layer may be selectively formed on the substrate. The fifth process chamber may be a RP Epi chamber that is available from Applied Materials, Inc. of Santa Clara, Calif. In one implementation, operation 140, operation 150 and operation 160 are performed in the same process chamber, such as a RP Epi chamber. The titanium silicide layer may be formed by a selective epitaxial deposition process. In one implementation, titanium and silicon precursors are flowed into the process chamber to form the titanium silicide layer. The titanium and silicon precursors initially may be in liquid form, and may be vaporized to form vapor prior to flow into the process chamber. In one implementation, one or more bubblers are utilized to vaporize the liquid precursors.

At operation 170, the substrate is transferred to a chamber for outgassing. The chamber may be part of the cluster tool that includes the first, second, third, fourth and fifth process chambers. In one implementation, the chamber may be a load-lock chamber. In another implementation, the chamber may be a pass through chamber.

An abatement process may be performed on the one or more process chambers. In one implementation, the abatement process is performed by an advanced foreline cleaning system, a dry clean absorber, and a combustible system. The foreline cleaning system may utilize ammonium fluoride ($NF_3$) to react with and bind any arsenic compounds in the foreline. The dry clean absorber may then remove the arsenic compounds from the foreline. The combustible system is utilized to convert any remaining hydrogen into water. The three stage exhaust abatement system provides for clean and safe disposal of by-products remaining within the chamber components after semiconductor processing.

Figure 2:
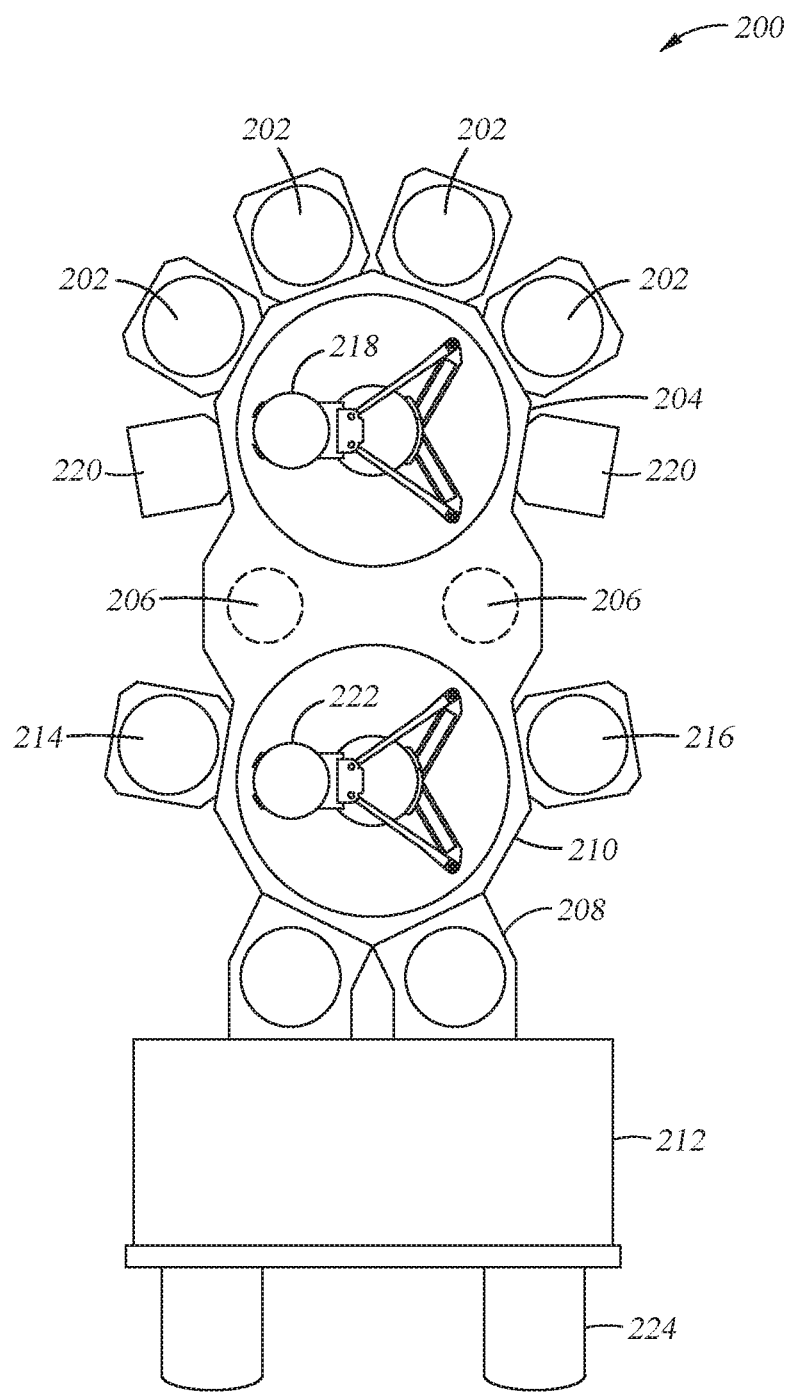
FIG. 2 is a schematic top view of a process system that can be used to complete the processing sequence illustrated in FIG. 1 according to implementations described herein.

FIG. 2 illustrates a process system 200 that can be used to perform the method 100 illustrated in FIG. 1, according to implementations of the disclosure. One example of the process system 200 is the Centura® system available from Applied Materials, Inc., of Santa Clara, Calif. As shown in FIG. 2, a plurality of process chambers 202 is coupled to a first transfer chamber 204. In one implementation, four process chambers 202 are coupled to the first transfer chamber 204, as shown in FIG. 2. In one implementation, the plurality of process chambers 202 are RP Epi chambers. In one implementation, one of the four process chambers 202 is utilized to perform operation 140, while the remaining three process chambers 202 are utilized to perform operations 150 and 160. In another implementation, all four process chambers 202 are utilized to perform operations 140, 150 and 160. The first transfer chamber 204 is also coupled to one or more pass through chambers 206 and one or more post process chambers 220. In one implementation, two pass through chambers 206 are coupled to the first transfer chamber 204 and two post process chambers 220 are coupled to the first transfer chamber 204. The one or more pass through chambers 206 may be utilized to perform operation 170. The post process chambers 220 may be degas, cooling or surface passivation chambers.

The first transfer chamber 204 has a centrally disposed transfer robot 218 for transferring substrates between the pass through chambers 206 and the process chambers 202. The pass through chambers 206 are coupled to a second transfer chamber 210, which is coupled to a cleaning chamber 214 for pre-clean the substrate (operation 120) and an etching chamber 216 for etching the substrate (operation 130). The cleaning chamber 214 may be particularly useful for performing a thermal or plasma-based oxidation process and/or a plasma assisted dry etch process. In one implementation, the cleaning chamber 214 is the SiCoNi™ chamber and the etching chamber 216 is the Selectra™ etch chamber. In one implementation, both operations 120 and 130 may be performed in a single process chamber, such as in the cleaning chamber 214.

The second transfer chamber 210 has a centrally disposed transfer robot 222 for transferring substrates between a set of load-lock chambers 208 and the cleaning chamber 214 or the etching chamber 216. Operation 170 may be performed in the load-lock chambers 208. A factory interface 212 is connected to the second transfer chamber 210 by the load-lock chambers 208. The factory interface 212 is coupled to one or more pods 224 on the opposite side of the load-lock chambers 208. The pods 224 typically are front opening unified pods (FOUP) that are accessible from the clean room.

During operation, a substrate is first transferred to the cleaning chamber 214 where a cleaning process is performed to remove native oxide and contaminants such as carbon or hydrocarbons from the substrate surface. The cleaning process is described in FIG. 1 under operation 120. Then the substrate is transferred to the etching chamber 216 in which operation 130 is performed. In one implementation, operations 120 and 130 may be performed in a single chamber 214.

The substrate is then transferred to one or more process chambers 202 in which operations 140, 150, and 160 are performed. The substrate may then be transferred to the chamber 206 or the load-lock chamber 208 for outgassing as described under operation 170. Because operations 120, 130, 140, 150, 160, and 170 may be performed within the same process system, vacuum is not broken as the substrate is transferred to various chambers, which decreases the chance of contamination and improves the quality of the deposited epitaxial film.

In summary, benefits of the present disclosure provide an integrated system and method for pre-cleaning a silicon-containing substrate prior to epitaxial deposition, a source drain etch back, epitaxial deposition utilizing a source drain extension, epitaxial deposition, and wafer outgassing which results in an improved semiconductor device. Clustering process chambers through vacuum transfer reduces exposure to atmosphere and correspondingly reduces exposure to oxygen contaminants. For example, performing inductively coupled plasma chlorine etching of silicon prior to epitaxial deposition without breaking vacuum between etching and deposition reduces exposure to oxygen contaminants. Clustering the native oxide removal chamber along with the etching of silicon and epitaxial deposition also leads to a reduction in oxygen contaminants. Thus, the integrated system advantageously provides for an improved semiconductor device.

While the foregoing is directed to implementations of the present disclosure, other and further implementations of the disclosure may be devised without departing from the basic scope thereof, and the scope thereof is determined by the claims that follow.

The invention claimed is:

1. A method for epitaxial deposition on substrate surfaces, comprising:
removing contaminants from a surface of a substrate in a process system, the substrate including one or more source/drain regions;
after the removing of the contaminants, forming an etched source/drain region by etching the surface of the substrate in the process system;
forming a source/drain extension layer on the etched source/drain region by a first epitaxial deposition process in the process system;
forming an epitaxial layer on the source/drain extension layer by a second epitaxial deposition process in the process system;
forming a silicide layer on the epitaxial layer by a third epitaxial deposition process in the process system; and
performing an outgas process on the substrate in the process system.

2. The method of claim 1, wherein the source/drain extension layer comprises doped silicon.

3. The method of claim 2, wherein the source/drain extension layer comprises silicon doped with arsenide.

4. The method of claim 2, wherein the epitaxial layer comprises doped silicon.

5. The method of claim 4, wherein the epitaxial layer comprises silicon doped with phosphorus.

6. The method of claim 4, wherein the silicide layer comprises titanium silicide.

7. The method of claim 1, wherein the removing the contaminants, forming the etched source/drain region, forming the source/drain extension layer, forming the epitaxial layer, forming the silicide layer, and performing the outgas process are performed without breaking vacuum.

8. A method for epitaxial deposition on substrate surfaces, comprising:
pre-cleaning, within a first process chamber, a surface of a substrate comprising silicon and having devices formed thereon;
transferring the pre-cleaned substrate from the first process chamber to a second process chamber without exposing the substrate to atmosphere;
etching, within the second process chamber, the devices on the pre-cleaned substrate;
transferring the etched substrate from the second process chamber to a third process chamber without exposing the substrate to atmosphere;
epitaxially depositing, within the third process chamber, an arsenide-doped silicon layer on the etched substrate;
transferring the substrate having the arsenide-doped silicon layer thereon from the third process chamber to a fourth process chamber without exposing the substrate to atmosphere;
epitaxially depositing, within the fourth process chamber, a phosphorous-doped silicon layer on the arsenide-doped silicon layer on the substrate;
transferring the substrate having the phosphorous-doped silicon layer thereon from the fourth process chamber to a fifth process chamber;
epitaxially depositing, within the fifth process chamber, a titanium silicide layer on the phosphorous-doped silicon layer on the substrate;
transferring the substrate having the titanium silicide layer thereon from the fifth process chamber to a sixth process chamber; and
outgassing, within the sixth process chamber, the substrate having the titanium silicide layer thereon.

9. The method of claim 8, wherein
the devices formed on the surface of the substrate comprise one or more source/drain regions,
the etching, within the second process chamber, the devices comprises etching silicon from the one or more source/drain regions.

10. The method of claim 8, wherein
the devices formed on the surface of the substrate comprise a plurality of semiconductor fins, each of which is disposed between two trenches formed of a dielectric material,
the etching, within the second process chamber, the devices comprises removing a portion of each semiconductor fin of the plurality of semiconductor fins,
the epitaxially depositing, within the third process chamber, the arsenide-doped silicon layer comprises epitaxially depositing the arsenide-doped silicon layer selectively on the removed portion of each semiconductor fin of the plurality of semiconductor fins, and
the epitaxially depositing, within the fourth process chamber, the phosphorous-doped silicon layer comprises epitaxially depositing the phosphorous-doped silicon layer selectively on the arsenide-doped silicon layer deposited on the removed portion of each semiconductor fin of the plurality of semiconductor fins.

11. The method of claim 8, wherein the pre-cleaning comprises removing oxides from the surface of the substrate by sputter etch processes.

12. The method of claim 8, wherein the pre-cleaning comprises removing oxides from the surface of the substrate by an $NF_3/NH_3$ based plasma dry etch process.

13. The method of claim 8, wherein the pre-cleaning comprises removing oxides from the surface of the substrate by an $NF_3/NH_3$ inductively coupled plasma based plasma dry etch process.

14. The method of claim 8, wherein the epitaxially depositing, within the fifth process chamber, the titanium silicide layer comprises flowing vaporized titanium and silicon precursors into the fifth process chamber.

15. A method for epitaxial deposition on substrate surfaces, comprising:
pre-cleaning, within a first process chamber, a surface of a substrate comprising silicon and having devices formed thereon;
etching, within the first process chamber, the devices on the pre-cleaned substrate;
transferring the etched substrate from the first process chamber to a second process chamber without exposing the substrate to atmosphere;
epitaxially depositing, within the second process chamber, an arsenide-doped silicon layer on the etched substrate;
epitaxially depositing, within the second process chamber, a phosphorous-doped silicon layer on the arsenide-doped silicon layer on the substrate;
transferring the substrate having the phosphorous-doped silicon layer thereon from the second process chamber to a third process chamber;
epitaxially depositing, within the third process chamber, a titanium silicide layer on the phosphorous-doped silicon layer on the substrate;
transferring the substrate having the titanium silicide layer thereon from the third process chamber to a fourth process chamber; and
outgassing, within the fourth process chamber, the substrate having the titanium silicide layer thereon.

16. The method of claim 15, wherein
the devices formed on the surface of the substrate comprise one or more source/drain regions,
the etching, within the first process chamber, the devices comprises etching silicon from the one or more source/drain regions.

17. The method of claim 15, wherein
the devices formed on the surface of the substrate comprise a plurality of semiconductor fins, each of which is disposed between two trenches formed of a dielectric material,
the etching, within the first process chamber, the devices comprises removing a portion of each semiconductor fin of the plurality of semiconductor fins,
the epitaxially depositing, within the second process chamber, the arsenide-doped silicon layer comprises epitaxially depositing the arsenide-doped silicon layer selectively on the removed portion of each semiconductor fin of the plurality of semiconductor fins, and
the epitaxially depositing, within the third process chamber, the phosphorous-doped silicon layer comprises epitaxially depositing the phosphorous-doped silicon layer selectively on the arsenide-doped silicon layer deposited on the removed portion of each semiconductor fin of the plurality of semiconductor fins.

18. The method of claim 15, wherein the pre-cleaning comprises removing oxides from the surface of the substrate by an $NF_3/NH_3$ based plasma dry etch process.

19. The method of claim 15, wherein the pre-cleaning comprises removing oxides from the surface of the substrate by an $NF_3/NH_3$ inductively coupled plasma based plasma dry etch process.

20. The method of claim 15, wherein the epitaxially depositing, within the third process chamber, the titanium silicide layer comprises flowing vaporized titanium and silicon precursors into the third process chamber.

* * * * *